United States Patent
Englin et al.

(10) Patent No.: US 7,120,836 B1
(45) Date of Patent: Oct. 10, 2006

(54) SYSTEM AND METHOD FOR INCREASING CACHE HIT DETECTION PERFORMANCE

(75) Inventors: Donald C. Englin, Shoreview, MN (US); Kelvin S. Vartti, Hugo, MN (US)

(73) Assignee: Unisys Corporation, Blue Bell, PA (US)

( * ) Notice: Subject to any disclaimer, the term of this patent is extended or adjusted under 35 U.S.C. 154(b) by 347 days.

(21) Appl. No.: 09/707,625

(22) Filed: Nov. 7, 2000

(51) Int. Cl.
*G06F 11/00* (2006.01)
(52) U.S. Cl. .................................. 714/53; 714/768
(58) Field of Classification Search .............. 714/5, 714/6, 21, 49, 52, 53, 757, 764, 768
See application file for complete search history.

(56) References Cited

U.S. PATENT DOCUMENTS

| | | | |
|---|---|---|---|
| 4,310,853 A * | 1/1982 | Madson | 348/441 |
| 4,483,003 A * | 11/1984 | Beal | 714/805 |
| 5,353,424 A * | 10/1994 | Partovi et al. | 711/128 |
| 5,509,119 A * | 4/1996 | La Fetra | 714/52 |
| 5,724,528 A * | 3/1998 | Kulik et al. | 710/311 |
| 5,916,314 A * | 6/1999 | Berg et al. | 714/6 |
| 5,926,484 A * | 7/1999 | Takusagawa | 714/710 |
| 6,038,693 A * | 3/2000 | Zhang | 714/768 |
| 6,226,763 B1 * | 5/2001 | Fu et al. | 714/53 |
| 6,477,635 B1 * | 11/2002 | Kahle et al. | 711/210 |
| 6,546,501 B1 * | 4/2003 | Hataida et al. | 714/6 |
| 6,629,206 B1 * | 9/2003 | Johnson | 711/145 |
| 6,654,925 B1 * | 11/2003 | Meaney et al. | 714/763 |
| 6,681,299 B1 * | 1/2004 | Shimamura et al. | 711/145 |
| 6,912,682 B1 * | 6/2005 | Aoki | 714/764 |

FOREIGN PATENT DOCUMENTS

JP     01273152 A   *   11/1989

OTHER PUBLICATIONS

Mano et al., "Pipelined Datapath" from Logic and Computer Design Fundamentals, 1997, Prentice-Hall, Inc., pp. 346-351.*

* cited by examiner

*Primary Examiner*—Scott Baderman
*Assistant Examiner*—Gabriel L. Chu
(74) *Attorney, Agent, or Firm*—Charles A. Johnson; Mark T. Starr; Hollingsworth & Funk, LLC (57) ABSTRACT

A system and method for increasing computing throughput through execution of parallel data error detection/correction and cache hit detection operations. In one path, hit detection occurs independent of and concurrent with error detection and correction operations, and reliance on hit detection in this path is based on the absence of storage errors. A single error correction code (ECC) is used to minimize storage requirements, and data hit comparisons based on the cached address and requested address are performed exclusive of ECC bits to minimize bit comparison requirements.

14 Claims, 5 Drawing Sheets

SYSTEM AND METHOD FOR INCREASING CACHE HIT DETECTION PERFORMANCE

FIELD OF THE INVENTION

This invention relates generally to cache memory systems, and more particularly to a method and apparatus for increasing cache hit detection performance in systems employing error detection and correction.

BACKGROUND OF THE INVENTION

A cache is generally a high speed memory system that stores the most recently used instructions or data from a larger, but slower, memory system. Because programs frequently use a subset of instructions or data repeatedly, the cache is a cost effective method of statistically enhancing the memory system, without having to resort to the expense of making all of the memory system faster.

In order to determine whether the requested data is stored in the cache, a comparison of the requested data address with the addresses stored in the cache is performed. For example, when a processor performs a read operation, it will first check to see if the requested data or instruction is in the cache by performing such a comparison. If, through hit detection, it is determined that the data/instruction is stored in the cache, it is considered a cache "hit," and the cache very quickly provides to the processor without having to access slower main memory. If the data or instruction is not found in the cache, it is considered a cache "miss." In the case of a cache miss, the processor fetches the item from main memory, and also stores a copy in the cache making it available in the cache for subsequent requests. Utilization of cache memories therefore requires some sort of comparison or "hit detection."

In addition to detecting cache hits, it may be desirable to ensure the integrity of the data stored in the cache or tag address memory through error detection and correction techniques. For example, error correction code (ECC), sometimes referred to as "error checking and correcting," allows accessed data to be checked for errors and, if necessary, immediately corrected. Generally, with respect to data storage, a unit of data is stored in memory, storage, cache, etc. A code corresponding to the bit sequence of the data is calculated and stored along with the data. For example, for each 64-bit word, an extra seven bits may be utilized to store the code. When the data is requested, a new code is calculated using the original algorithm for the data, and the new code is compared to the code that was originally stored with the data. If the codes match one another, the data is considered error-free. Otherwise, the missing or erroneous bits are corrected using the code comparison. An example of such an ECC is the Reed-Solomon code, which includes error detection and error correction codes based on mathematical algorithms and binary structural logic, which is thus able to detect and restore incorrect and/or missing bits.

In many prior art systems, hit detection and error detection/correction has been performed in a serial manner. Data would be read from the memory, send through the ECC circuitry, then through hit detection circuitry, and finally processed. This serial methodology is inefficient, as data is always subjected to the ECC circuitry even though no error correction is necessary a large majority of the time.

Prior art systems have also utilized multiple error correction codes, requiring additional memory capacity to house all of the ECC information. Further, these prior art systems perform a comparison of all bits, including ECC bits, which adversely affects performance.

Therefore, it would be desirable to provide a system and method for increasing computing throughput by concurrently performing data error detection/correction and cache hit detection in parallel, while reducing compare times and required memory sizes. The present invention provides a solution to these and other problems of the prior art, and offers other advantages over the prior art.

SUMMARY OF THE INVENTION

The present invention generally relates to a system and method for increasing computing throughput through execution of parallel data error detection/correction and cache hit detection operations. In one path, hit detection occurs independent of and concurrent with error detection and correction operations, and reliance on such "fast path" hit detection is based on the absence of storage errors. The present invention utilizes a single error correction code (ECC), to minimize storage requirements, and performs "hit" comparisons based on the cached address and requested address, exclusive of ECC bits, so that fewer bits are compared and performance is increased.

In accordance with one embodiment of the invention, a method is provided for efficiently processing cache memory accesses in a computing system. The computing system includes at least one requester to submit memory access addresses for requested data, and a tag memory to store tag addresses corresponding to addresses stored in the cache memory. The method includes retrieving a stored tag address from the tag memory in response to the requester submitting a memory access address. A first comparison of the memory access address and the stored tag address is performed to determine whether the requested data is stored in the cache memory. The method includes monitoring for errors in the stored tag address, which is performed at the same time that the first comparison of the memory access address and the stored tag address is being performed. If a tag address error is detected, the first comparison is disregarded, the tag address error is corrected, and a second comparison of the memory access address and the corrected tag address is performed to determine whether the requested data is stored in the cache memory. If no tag address error is detected, the results of the first comparison are used to determine whether there is a cache hit or miss.

In accordance with another embodiment of the invention, a cache hit detector is provided, which includes a tag memory to store tag addresses corresponding to addresses currently cached, a fast hit detection circuit, and a slow hit detection circuit. The fast hit detection circuit includes a first address compare module coupled to the tag memory to receive a tag address, and to compare the tag address to the address of the information being requested. An error detector is coupled to the tag memory to receive the tag address and to determine whether there are any errors in the tag address. A gated output module is coupled to the first address compare module and the error detector, and provides a fast hit indication if and only if no error is discovered by the error detector and the requested address is stored in the tag memory. The slow hit detection circuit includes an error correction circuit coupled to the tag memory to correct errors in the tag address, and also includes a second address compare module to compare the corrected tag address to a current address. In more particular embodiments, the fast hit detection circuit and the slow hit detection circuit are coupled in parallel, so that the first address compare module and the error detector perform their respective operations concurrently with the operations of the second address compare module and the error correction circuit. In another embodiment, the cache hit detector is utilized in a data processing system that includes a main memory module for storing data, at least one cache memory to cache some of the data, and at least one processing unit in which the cache hit detector is associated.

Still other objects and advantages of the present invention will become readily apparent to those skilled in this art from the following detailed description. As will be realized, the invention is capable of other and different embodiments, and its details are capable of modification without departing from the scope and spirit of the invention. Accordingly, the drawing and description are to be regarded as illustrative in nature, and not as restrictive.

BRIEF DESCRIPTION OF THE DRAWINGS

The invention is described in connection with the embodiments illustrated in the following diagrams.

DETAILED DESCRIPTION OF THE ILLUSTRATED EMBODIMENTS

Generally, the present invention is directed to a system and method for increasing computing throughput by concurrently performing data error detection/correction and cache hit detection in parallel. The present invention allows hit detection to occur independently and concurrently of error detection and correction, and controls "fast path" hit detection based on the discovery of data errors. The present invention utilizes a single error correction code (ECC), to minimize storage requirements. The invention performs "hit" comparisons based on the cached address and requested address, exclusive of ECC bits, so that fewer bits are compared and performance is increased.

The present invention may be used in connection with a processor or multiple processors in a computing environment having a memory, including a single processor system having a single instruction stream, a multi-tasking system, a multi-processing system having multiple processors, a pipelined processing system where instructions are executed in instruction segments along an instruction pipeline, and the like. While the present invention is particularly advantageous in the context of multiprocessing, pipelined computer systems, the present invention is not limited thereto and is equally applicable in other computing environments utilizing hit detection and error detection and correction. The present invention is thus not limited to the particular computing environments and embodiments described in the following figures, as will be readily appreciated by those skilled in the art from the description provided herein.

Figure 1:
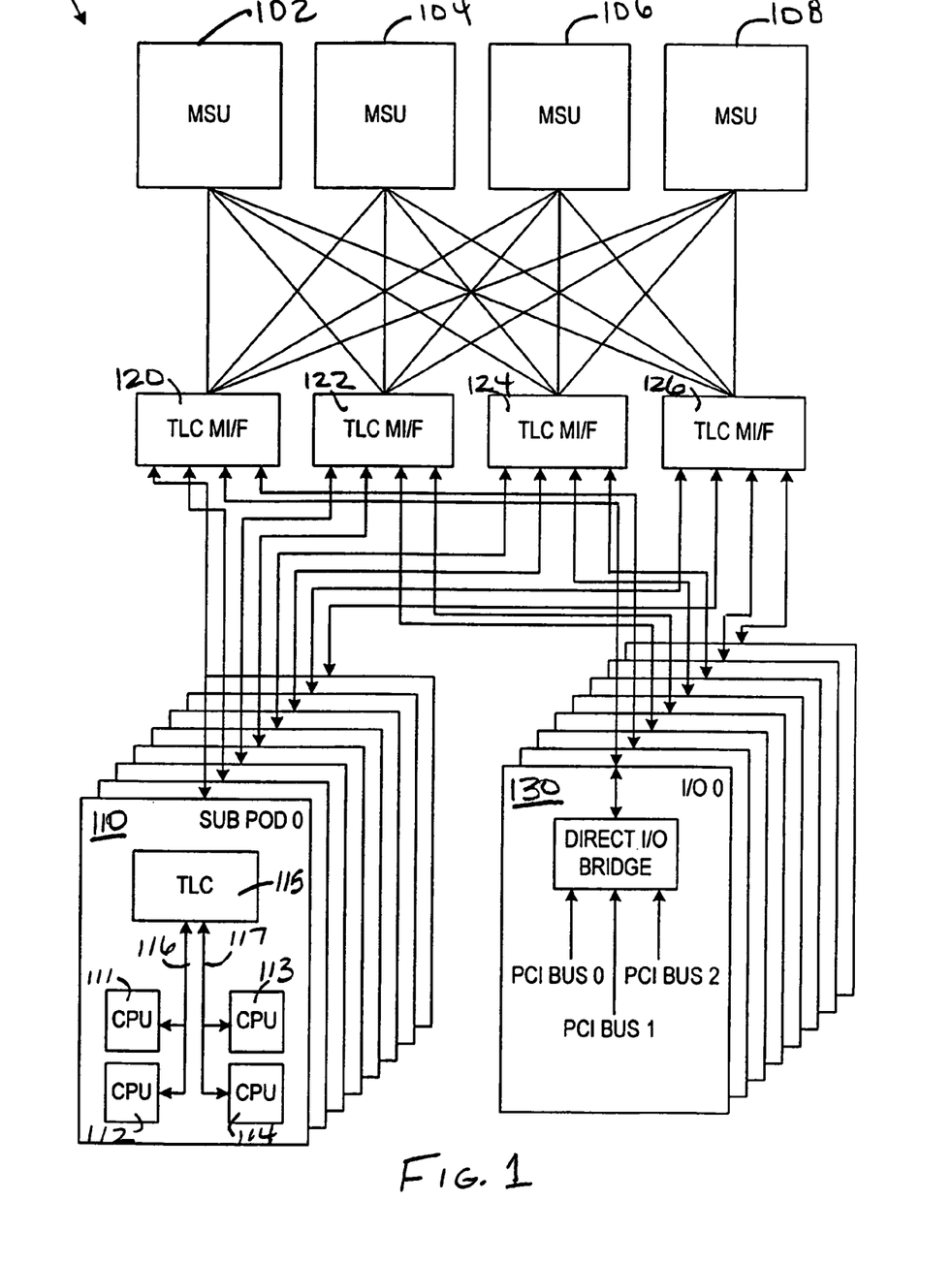
FIG. 1 is a block diagram of a computing system in which the principles of the present invention may be applied.

FIG. 1 is a block diagram of a computing system 100 in which the principles of the present invention may be applied. System 100 includes a main storage module, illustrated as a plurality of Memory Storage Units (MSUs) labeled MSU 102, MSU 104, MSU 106 and MSU 108. The collective MSU represents the main memory, such as random access memory, for the computing system 100. This memory may be accessible to multiple subpods, such as subpod 110, via one or more third level cache memory interfaces (TLC MI/F) 120, 122, 124, 126. The computing system 100 may further include multiple input/output (I/O) modules, such as I/O module 130, that provide the interface between various I/O devices and the subpods. The TLC MI/F circuitry 120, 122, 124, 126 collectively serve as a crossbar module to selectively transfer data between the MSUs, and the I/O modules and subpods.

Each subpod (e.g., subpod 110) includes one or more processing modules, such as modules 111, 112, 113, 114, each of which may include its own first level cache (FLC) and second level cache (SLC), and may in turn be coupled to a third level cache (TLC) 115 via one or more buses 116, 117. An example of such a processing module (e.g., module 111) is provided in the block diagram of FIG. 2. While the particular logic functions within the processing module 200 of FIG. 2 may vary by design, a number of particular logic functions are illustrated in the processing module 200 for purposes of obtaining an understanding of one aspect of the invention.

Figure 2:
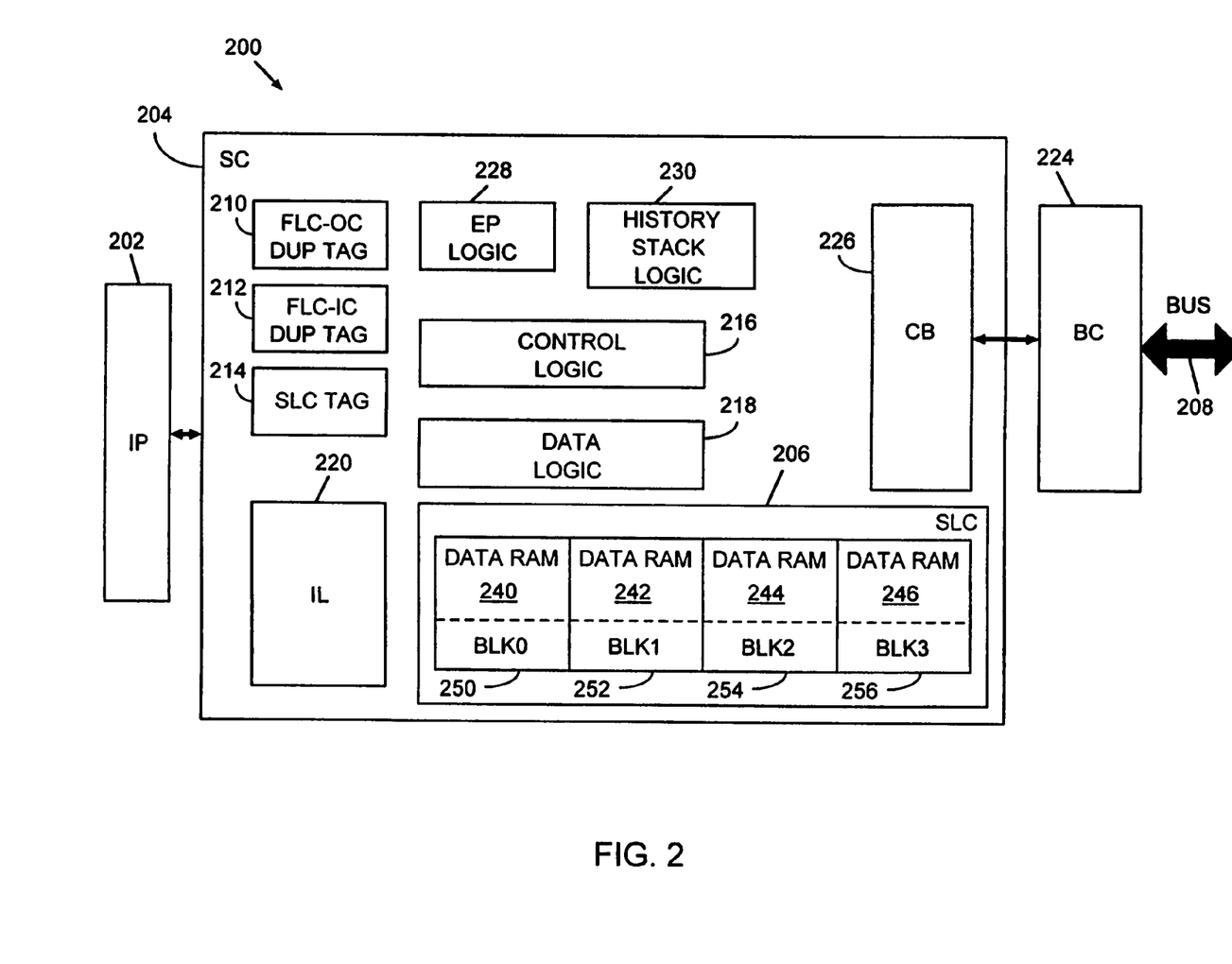
FIG. 2 is a block diagram of an example processing module in which the principles of the present invention may be applied.

Referring now to the example processing module 200 of FIG. 2, an instruction processor (IP) 202 performs various processing operations required by the computing system. The IP 202 interfaces with the storage controller (SC) 204, that includes a second level cache (SLC) 206 and the associated control and interface logic. In one embodiment, the SLC is an ownership-based cache that is dedicated to a single IP. The SC 204 interfaces with a bus 208, depicted in FIG. 1 as bus 116 or 117, which in turn interfaces to the TLC 115 in its respective subpod. The bus 208 may be any known bussing arrangement, such as a P7 bus or variation thereof.

The SC 204 includes a variety of different logic sections, some of which are depicted in FIG. 2. The instruction processor 202 of the present example includes a first level cache (FLC), and because the example computing environment is an ownership-based system, FLC duplication tag logic modules 210 and 212 are provided. In systems having multiple instruction processors with FLCs, multiple SLCs, TLCs, and main storage units, cache coherency must be maintained. Cache coherency protocols ensure that one processor's cached copy of a shared memory location is invalidated when another processor writes to that location, thereby guaranteeing that each processor is always operating on the latest copy of the data. Many known methods exist to maintain cache coherency. Some earlier systems achieve coherency by implementing memory locks. That is, if an updated copy of data existed within a local cache, other processors were prohibited from obtaining a copy of the data from main memory until the updated copy was returned to main memory, thereby releasing the lock. Other manners of maintaining cache coherency exist, such as memory bus "snooping", and other techniques. For distributed systems having hierarchical memory structures, directory-based coherency systems have been used. Directory-based coherency systems utilize a centralized directory to record the location and the status of data as it exists throughout the system, thereby determining "ownership" of the data. For example, the directory records which caches have a copy of the data, and further records if any of the caches have an updated copy of the data. When a cache makes a request to main memory for a data item, the central directory is consulted to determine where the most recent copy of that data item resides. Based on this information, the most recent copy of the data is retrieved so it may be provided to the requesting cache. The central directory is then updated to reflect the new status for that unit of memory.

In the example of FIG. 2, FLC cache coherency is achieved by using invalidate logic and associated interfaces in the SC 204 to invalidate FLC cache locations in the IP 202 when cache write functions are performed. Since multiple IPs 202 in different processing modules may contain the same data block in one or both of its caches, all other copies of that data block must be located and invalidated when a requester performs a data write function. Each IP 202 contains two "tag" memories that record which blocks currently reside in its caches. One tag memory is used in connection with the instruction cache, and one with the operand cache. Each SC 204 has a duplicate copy of its associated IP's tag memory that contains copies of the data blocks currently resident in their respective IP caches. The first level cache operand cache (FLC-OC) dup tag logic 210 is the tag memory for the FLC-OC, and the first level cache instruction cache (FLC-IC) dup tag logic 212 is the tag memory for the FLC-IC. Each write request that occurs in the system may generate an invalidate/snoop request to all the other duplicate tags in the system. Each duplicate tag will perform a search to determine if the data block is resident (i.e., a "hit"). If a hit occurs, that IP's tag must be invalidated. Where no hit occurs, no action is required. The second level cache (SLC) tag memory 214 performs an analogous function for the SLC 206.

The control logic 216 controls the access to the SLC 206 based on the SLC tag 214, by generating requests to the data logic (DL) 218. The data logic 218 controls the data flow in the SC 204, including read hit and miss data to the IP 202, as well as other control functions. Generally, the control logic 216 and SLC tag 214 determine whether a request is a hit or a miss in the SLC 206, and if it's a hit, data can be written and read from the SLC 206 if it owns the data—otherwise ownership is acquired, and then the function is performed.

The input logic (IL) 220 captures data requests and prioritizes all requests that the SC 204 is going to act on. The requests include those from the IP 202, and from other processing modules and caches received via the bus 208. The information available at the IL 220 may include the function and address of the request, whether the particular SC 204 "owned" the data for cache coherency purposes, the requester identification, and any other associated request information.

Bus interface logic interfaces the SC 204 to the bus 208. In one embodiment, the bus interface logic is divided into two sections. A first section operates under the clock on the bus 208, which is a slower clock rate than the internal clock rate of the processing module. This first section is the BC (bus control 1) 224. A second section, the CB (bus control 2) 226 interfaces to the ASIC (i.e., processing module 200) that ultimately interfaces with the IL 220 via the data logic 218. The data logic 218 transfers data back and forth between the CB 226 and the IL 220.

The error and partitioning (EP) logic 228 represents an error collection module. Internal errors get routed to the EP 228 and are collected. Once collected, they may be scanned out via a dynamic string to report errors to maintenance logic. The EP 228 may also provide a trigger to start and stop collecting history data in the history stack 230. The history stack logic 230 stores the state of the system upon the occurrence of an internal error.

The SLC 206 includes data storage capability, which in one embodiment includes multiple data RAM storage devices. In one particular embodiment, the cache data storage is contained in 32 16Kx22 bit internal RAMs, split across four block sections 240, 242, 244, 246. Associated with the data RAMs is the error logic 250, 252, 254, 256, which includes error correction code (ECC) generation and correction logic, herein generally referred to as "block logic" or BLK logic. In one embodiment, each block is contained in eight RAM devices organized into 32Kx2 word (even/odd) blocks. The data RAM address bits are issued from the control logic 216, and an address bit is used to select between the pair of RAM devices.

Figure 3:
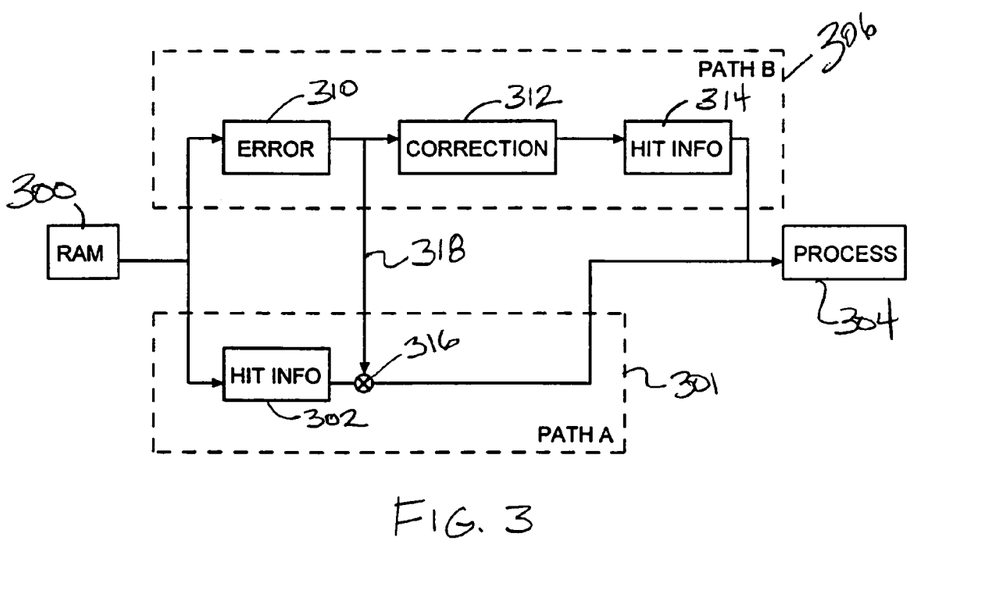
FIG. 3 is a block diagram of an apparatus for performing parallel error checking and hit detection in accordance with the principles of the present invention.

FIG. 3 is a block diagram of an apparatus for performing parallel error checking and hit detection in accordance with the principles of the present invention. Data stored in the memory, such as the RAM 300, is transmitted along two discrete processing paths. In one path, path A 301, it is assumed that no data error will be discovered, and therefore the hit detection circuit 302 can immediately begin processing the raw data from the RAM 300. Assuming that no error is detected in the data retrieved from the RAM 300, the hit detection circuit 302 immediately processes the data, determines whether or not a hit is detected, and immediately processes the data at processing circuitry 304. This path introduces no unnecessary delays, as is likely that no errors in the data will be found. As will be described more fully below, this low latency path A 301 is always used where no errors occur; however activity on this path will be suspended upon recognition of a data error.

The second path B 306 in which the raw RAM 300 data is provided includes error detection circuitry 310 an error correction circuitry 312, in addition to hit detection circuitry 314. The same RAM data sent to the hit detection circuitry 302 is sent to the error detection circuitry 310 and correction circuitry 312 where data errors are detected and corrected in accordance with a predetermined ECC (error correction code) methodology or algorithm. Generally, ECC, sometimes referred to as "error checking and correcting," allows accessed data to be checked for errors and, if necessary, immediately corrected. It differs from parity checking in that errors are not only detected, but are also corrected. Generally, with respect to data storage, a unit of data is stored in memory, storage, cache, etc. A code corresponding to the bit sequence of the data is calculated and stored along with the data. For example, for each 64-bit word, an extra seven bits may be utilized to store the code. When the data is requested, a new code is calculated using the original algorithm for the data, and the new code is compared to the code that was originally stored with the data. If the codes match one another, the data is considered error-free. Otherwise, the missing or erroneous bits are corrected using the code comparison. An example of such an ECC is the Reed-Solomon code, which includes error detection and error correction codes based on mathematical algorithms and binary structural logic, which is thus able to detect and restore incorrect and/or missing bits.

If an error is detected at error detection circuitry 310, processing on the "fast" path A 301 is terminated. This is represented by the termination node 316 which, as depicted, is controlled by a signal on line 318 indicating that an error has been detected in the RAM data. For example, a flag can be set indicating that an error has occurred, and this flag can then be monitored in order to control the progression and potential termination of hit detection on path A 301. As another example, recognition of an error at error detection circuit 310 could cause an interrupt, and an interrupt handler routine can halt processing via path A 301. A further example may include a hardware latch which is controlled by the state of the error detection circuit 310, such that a latched error signal disables (e.g., removes an enable signal) for the hit detection circuit 302, or causes the remaining circuitry (i.e., processing circuitry 304) to disregard any activity along path A 301. Other manners of disregarding activity in path A 301 upon recognition of an error condition at the error detection circuitry 310 are within the scope and spirit of the present invention.

When a data error is detected, hit detection processing is discontinued at hit detection circuitry 302, and all further activity for that particular request will occur on the "slow" path B 306. This involves subjecting the data to the error correction circuitry 312, and after the data has been corrected, presenting the corrected data to the hit detection circuitry 314. As can be seen, a sequential progression of events occurs along path B 306, where errors are detected and corrected, and hit detection is subsequently performed. This sequence of events is more time-consuming than the alternate fast path, where only the hit detection circuitry 302 is encountered. However, if an error occurs, utilizing information on the path consisting of the hit detection circuitry 302 alone could result in inaccurate information being processed at processor 304. Therefore, when an error is detected at error detection circuitry 310, processing at the hit detection circuitry 302 is discontinued and any results are disregarded, and all processing occurs along path B 306. Because it is most commonly the case where there are no errors in the data, the faster route (i.e., path A 301 in the instant example) will ordinarily be taken, thereby minimizing latencies caused by error detection and correction processing applied to data that ultimately proved to be error-free.

Figure 4:
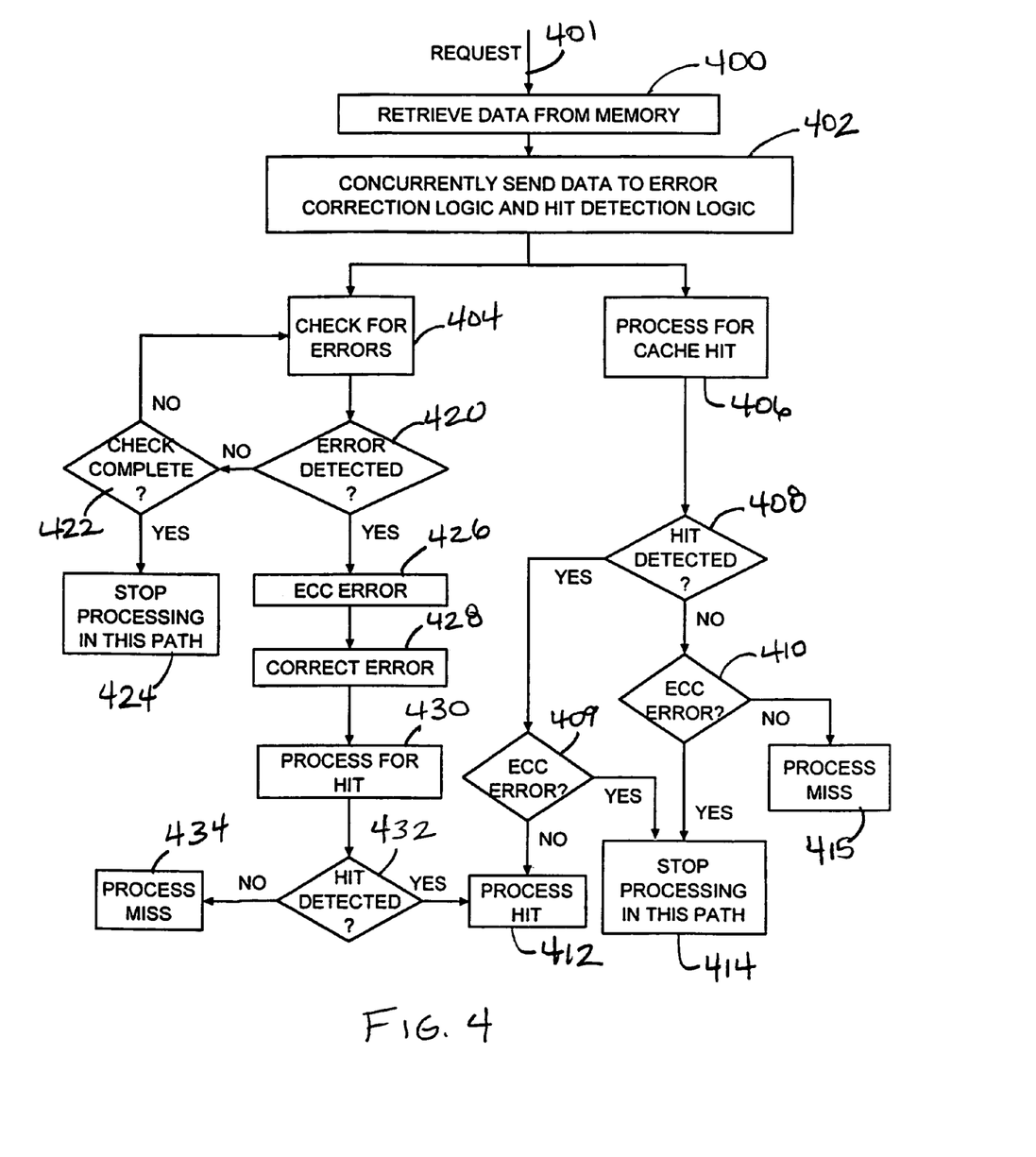
FIG. 4 is a flow diagram illustrating one embodiment of a method for reducing latencies in accessing data from cache memories.

FIG. 4 is a flow diagram illustrating one embodiment of a method for reducing latencies in accessing data from cache memories. A request 401 for information initiates data being retrieved 400 from memory, such as the second level cache 206 identified in FIG. 2. Because a request for data requires a check to determine whether the requested data is cached, hit detection must be performed to determine whether or not the requested data is stored in the second level cache. Further, because of the possibility of data storage and transmission errors, error detection and correction of the data is performed. In accordance with the present invention, the data is concurrently sent to the error correction logic and hit detection logic as illustrated at block 402. This is depicted by the parallel paths leading to the check error block 404 and the cache hit processing block 406.

The fast path includes block 406 where hit detection is immediately initiated. Until a hit is detected (or a cache "miss" is confirmed) as determined at decision block 408, processing 406 for a cache hit continues. When a hit is detected 408 and no ECC error is detected 409, the data can be processed 412. If a hit is detected 408 but an ECC error is detected 409, processing in the fast path is terminated as illustrated at block 414. Further, if no hit is detected as determined at decision block 408, and it is determined at decision block 410 that an error is detected, processing in the fast path is terminated 414. Otherwise, if no ECC error is detected, the "miss" is processed 415, such as by requesting the data from main memory. In this manner, processing 406 for the cache hit will continue until a "hit" or "miss" is identified, or until an ECC error is detected.

The slow path includes block 404 where hit detection is suspended until error detection and correction has been performed. This can be seen at decision block 420 where it is determined whether or not any data errors are detected. If no errors are detected, but the error detection is not complete as determined at decision block 422, the system continues to check for errors. If on the other hand, an error is not detected as determined at decision block 420, but it is determined that the error check is complete at decision block 422, this is indicative of a determination of error-free data, and processing in this slow path may be terminated as illustrated at block 424. Thus, in this instance, the fast path will govern hit detection for this particular data.

If an error is detected at block 420, an ECC error is noted as shown at block 426, and is corrected 428. It is recognition of the ECC error 426 that is used in the fast path to determine whether or not there is an error as determined at decision blocks 409, 410. After errors have been detected 420 and corrected 428, hit detection 430 is initiated in the slow path, since discovery of an error terminates fast path hit detection and causes slow path hit detection to govern for this particular data. Hit detection continues until a hit is detected as determined at decision block 432, or until it is determined that the data is not present in the cache (i.e., it is determined that it is a "miss" condition and the data needs to be retrieved from the next memory level). If a hit is detected, the data can be processed 412. In the case of a cache miss, processing continues at the process miss block 434, where the data may be obtained from main memory.

Figure 5:
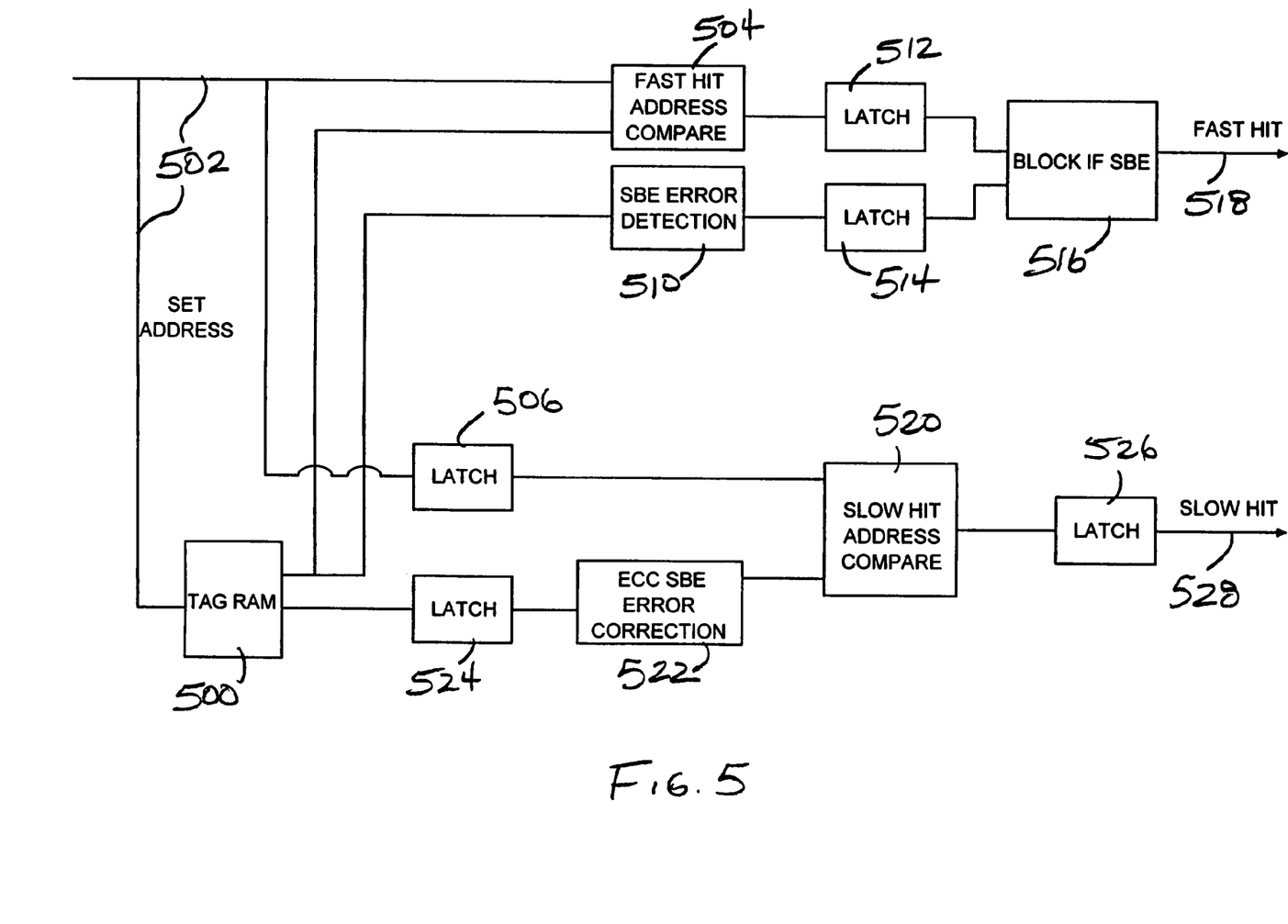
FIG. 5 is a block diagram of a preferred embodiment of a parallel error correction and hit detection circuit in accordance with the principles of the present invention.

FIG. 5 is a block diagram of a preferred embodiment of a parallel error correction and hit detection circuit in accordance with the principles of the present invention. In the present invention, only one ECC code is processed, which includes the tag address, valid bits, ownership bits and written bit. Cache memories are made up of blocks of data, where each block of data has an address tag that identifies its corresponding main memory block. In the example of FIG. 5, the tag address is the address stored in the tag RAM 500. A processor asserting an address to perform a data transaction (e.g., read or write) provides the tag address on line 502, which is provided to the tag RAM 500, the fast hit address compare 504, and the latch 506. The tag RAM 500 stores the address tags, which are later compared at the fast hit address compare 504 when the processor asserts an address. The asserted address, shown as the set address on line 502, is input to the tag RAM 500 and the fast hit address compare 504, so that the fast hit address compare 504 can determine whether the data at the requested address is stored in the memory/cache (i.e., determine whether there is a "hit").

As the fast hit address compare 504 is performing a compare function, the single bit error (SBE) detector 510 performs error detection to determine whether there is a memory error affecting the information stored in the tag RAM 500. The results of the fast hit address compare 504 and the SBE error detection 510 are latched in latches 512 and 514 respectively. If the fast hit address compare 504 detects a "hit," it is latched at latch 512, and presented to a gate 516, labeled the "block if SBE" gate. The circuit, or gate, 516 allows or disallows a fast hit signal on line 518, depending on whether an error was detected at SBE error detector 510. If the SBE error detection 510 did not detect an error, the signal presented to gate 516 via latch 512 will be allowed to pass. In this case, a fast hit signal at the output 518 occurs. If the SBE error detection 510 detected an error, the signal presented to gate 516 via latch 512 will not be allowed to pass to the output 518. The error signal latched at latch 514 (e.g., an enable/disable signal) blocks the latched signal from latch 512 from passing. The signal from latch 512 should be blocked in this instance, since a detected error would indicate that the fast hit was incorrectly latched due to detection of an error. In this manner, an address hit comparison is immediately performed, but "blocked" if an error is detected.

It is important to note that in accordance with a preferred embodiment of the present invention, only the address bits are compared at the fast hit address compare 504. No ECC bits are compared. This allows fewer bits to be compared by the compare logic, thereby increasing the compare speed in the fast hit path. By using a smaller compare, a faster cycle time can be used, thus increasing performance.

On the slow hit path, the slow hit address compare circuit 520 receives the set address via latch 506, as well as an address from the tag RAM 500 that has been error corrected at the ECC SBE error correction circuit 522. The ECC SBE error correction circuit 522 receives its address information from the tag RAM 500 via latch 524. When the SBE error detection circuit 510 detects an error and disables passage of a fast hit signal to output 518, it also enables the output of the slow hit address compare 520 to be latched at latch 526, and to issue a slow hit signal at output 528. Therefore, if an SBE error occurs, the slow hit path is used, and the fast hit path is disabled. In one embodiment, the error correction is performed contemporaneously with error detection, while in alternative embodiments the error correction is performed subsequent to detection of an error. For example, error correction processing may be initiated upon recognition of an error.

Figure 6:
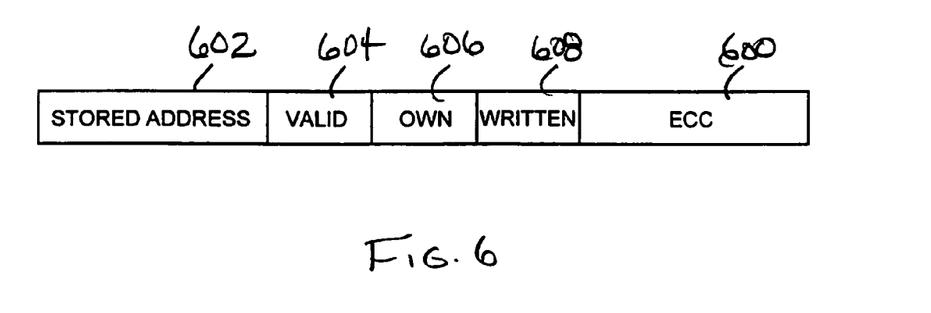
FIG. 6 illustrates the various data fields associated with the ECC code in accordance with an exemplary embodiment of the invention.

As indicated above, only one ECC code is processed, which includes the tag address, valid bits, ownership bits and written bit. FIG. 6 illustrates the various data fields associated with the ECC code in accordance with an exemplary embodiment of the invention. In accordance with a preferred embodiment of the invention, only one ECC code is used, rather than multiple ECC codes. The single ECC code 600 includes a plurality of ECC bits forming a code corresponding to the bit sequence of the data, which is then stored along with the data. The ECC code 600 is formed from the plurality of data fields, including the stored address 602, the valid field 604, the ownership field 606 and the written field 608. A preferred embodiment of the invention uses only one ECC code for all of the data fields, so that fewer ECC bits need to be stored in the memory, thereby reducing the requisite size of memory. However, in performing the fast hit address compare in accordance with one embodiment of the invention, only the stored address in field 602 is compared to the address presented by the processor (i.e., the "set address"), and no comparison of ECC bits is performed.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. A method for processing cache memory accesses in a computing system having a requester to submit memory access addresses for requested data, and having a tag memory to store tag addresses corresponding to addresses stored in the cache memory, the method comprising:

retrieving a stored tag address from the tag memory in response to the requester submitting a memory access address;

performing a first comparison of only the memory access address to the stored tag address, without regard to any error correction code associated with the stored tag address, to determine whether the requested data is stored in the cache memory and storing in a first latch a result of the first comparison;

monitoring for an error in the stored tag address contemporaneously with the first comparison of the memory access address and the stored tag address and storing in a second latch a result of the monitoring for errors, wherein monitoring for errors in the stored tag address comprises identifying at least one error using a single error correction code associated with the stored tag address in the tag memory, wherein the single error correction code is coded to provide error detection for the stored tag address and a plurality of configuration fields;

if a tag address error is detected in the stored tag address, blocking output from the first latch in response to output from the second latch, correcting the tag address error using an error correction code associated with the stored tag address, and performing a second comparison of the memory access address and the corrected tag address to determine whether the requested data is stored in the cache memory, wherein the second comparison compares only the corrected tag address with the memory access address, and disregards comparison of any stored error correction code bits; and if no tag address error is detected in the stored tag address, passing output from the first latch in response to output from the second latch to determine whether the requested data is stored in the cache memory.

2. The method of claim 1, wherein performing the first comparison and monitoring for errors in the stored tag address occur in parallel with correcting the tag address error and performing the second comparison.

3. The method of claim 1, wherein correcting the tag address error and performing the second comparison are initiated upon recognition of a tag address error.

4. The method of claim 1, wherein disregarding the first comparison comprises blocking passage of the results of the first comparison through an output gate.

5. The method of claim 4, wherein blocking passage of the first comparison results comprises:

providing an error signal to the output gate when a tag address error is detected; and disabling an output of the output gate upon receipt of the error signal.

6. The method of claim 5, further comprising enabling the tag address error to be corrected and the second comparison of the memory access address and corrected tag addresses to be performed in response to the error signal.

7. A cache hit detector, comprising:

(a) a tag memory to store tag addresses corresponding to addresses currently cached, and further to store an error correction code for each block of data stored in the tag memory, wherein each block of data is associated with a single error correction code, and the single error correction code provides error correction capabilities for the stored tag address and a plurality of configuration fields;

(b) a fast hit detection circuit, comprising:

(i) a first address compare module coupled to the tag memory to receive a tag address and to compare only the tag address to a requested address without involving the error correction code in the comparison;
(ii) an error detector coupled to the tag memory to receive the tag address and to determine whether there are any errors in the tag address;
(iii) a gated output module coupled to the first address compare module and the error detector to output a fast hit indication if the requested address is stored in the tag memory as determined by the comparison of only the tag address and the requested address, and if and only if no error is discovered by the error detector;
(iv) a first latch coupled to the first address compare module to latch comparison results;
(v) a second latch coupled to the error detector to latch a resulting error indicator signal; and
wherein the comparison results and the error indicator signal are not passed to the gated output until both the comparison results and the error indicator signal are available at the first and second latches, and until simultaneously clocked to concurrently provide the comparison results and the error indicator signal to the gated output; and
(c) a slow hit detection circuit, comprising:
(i) an error correction circuit coupled to the tag memory to receive the tag address and to correct errors in the tag address; and
(ii) a second address compare module coupled to the error correction circuit to receive the corrected tag address and to compare only the corrected tag address to address without involving any error correction code in the comparison.

8. The cache hit detector as in claim 7, wherein the fast hit detection circuit and the slow hit detection circuit are coupled in parallel such that the first address compare module and the error detector perform operations concurrently with operations of the second address compare module and the error correction circuit.

9. The cache hit detector as in claim 7, further comprising latching means to coordinate timing between the fast hit detection circuit and the slow hit detection circuit.

10. The cache hit detector as in claim 7, wherein the first address compare module and the error detector are coupled in parallel to contemporaneously compare the tag address to a requested address and determine whether there are any errors in the tag address.

11. The cache hit detector as in claim 7, wherein the error detector determines whether there are any single bit errors in the tag address.

12. A data processing system comprising:
(a) a main memory module for storing data;
(b) at least one cache memory coupled to the main memory module to cache at least a portion of the data stored in the main memory module;
(c) at least one processing unit to process data and to control data access with the main memory module and the cache memory, the processing unit comprising:
(1) a tag memory to store tag addresses corresponding to addresses currently cached, wherein the tag memory further stores an error correction code associated with each block of data, wherein each block of data is associated with a single error correction code, and the single error correction code provides error correction capabilities for the stored tag address and a plurality of configuration fields;
(2) a fast hit detection circuit, comprising:
(i) a first address compare module coupled to the tag memory to receive a tag address and to compare only the tag address to a requested address without involving the error correction code in the comparison;
(ii) an error detector coupled to the tag memory to receive the tag address and to determine whether there are any errors in the tag address;
(iii) a gated output module coupled to the first address compare module and the error detector to output a fast hit indication if the requested address is stored in the tag memory as determined by the comparison of only the tag address and the requested address, and if and only if no error is discovered by the error detector;
(iv) a first latch coupled to the first address compare module to latch comparison results;
(v) a second latch coupled to the error detector to latch a resulting error indicator signal; and
wherein the comparison results and the error indicator signal are not passed to the gated output until both the comparison results and the error indicator signal are available at the first and second latches, and until simultaneously clocked to concurrently provide the comparison results and the error indicator signal to the gated output; and
(3) a slow hit detection circuit, comprising:
(i) an error correction circuit coupled to the tag memory to receive the tag address and to correct errors in the tag address; and
(ii) a second address compare module coupled to the error correction circuit to receive the corrected tag address and to compare only the corrected tag address to the requested address without involving any error correction code in the comparison.

13. The data processing system of claim 12, wherein the fast hit detection circuit and the slow hit detection circuit are configured in parallel such that the first address compare module and the error detector perform operations concurrently with operations of the second address compare module and the error correction circuit.

14. An apparatus for processing cache memory accesses in a computing system having a requester to submit memory access addresses for requested data, and having a tag memory to store tag addresses corresponding to addresses stored in the cache memory, the method comprising:
means for retrieving a stored tag address from the tag memory in response to the requester submitting a memory access address;
means for performing a first comparison of only the memory access address to the stored tag address, without regard to any error correction code associated with the stored tag address, to determine whether the requested data is stored in the cache memory and storing in a first latch a result of the first comparison;
means for monitoring for an error in the stored tag address contemporaneously with the first comparison of the memory access address and the stored tag address and storing in a second latch a result of the monitoring for errors, wherein the means for monitoring comprises means for identifying at least one error using a single error correction code associated with the stored tag address in the tag memory, wherein the single error correction code is coded to provide error detection for the stored tag address and a plurality of configuration fields;

means, responsive to detection of a tag address error in the stored tag address, for blocking output from the first latch in response to output from the second latch, correcting the tag address error using an error correction code associated with the stored tag address, and performing a second comparison of the memory access address and the corrected tag address to determine whether the requested data is stored in the cache memory, wherein the second comparison compares only the corrected tag address with the memory access address and disregards comparison of any stored error correction code bits; and means, responsive to no detection of a tag address error in the stored tag address, for enabling output from the first latch in response to output from the second latch to determine whether the requested data is stored in the cache memory.

* * * * *